(12) United States Patent
Hioka et al.

(10) Patent No.: US 10,263,176 B2
(45) Date of Patent: Apr. 16, 2019

(54) SEMICONDUCTOR DEVICE HAVING VERTICAL HALL ELEMENT

(71) Applicant: SII Semiconductor Corporation, Chiba-shi, Chiba (JP)

(72) Inventors: Takaaki Hioka, Chiba (JP); Mika Ebihara, Chiba (JP)

(73) Assignee: ABLIC INC., Chiba (JP)

( * ) Notice: Subject to any disclaimer, the term of this patent is extended or adjusted under 35 U.S.C. 154(b) by 52 days.

(21) Appl. No.: 15/808,304

(22) Filed: Nov. 9, 2017

(65) Prior Publication Data

US 2018/0159025 A1 Jun. 7, 2018

(30) Foreign Application Priority Data

Dec. 5, 2016 (JP) ................................. 2016-235998

(51) Int. Cl.
*H01L 43/06* (2006.01)
*H01L 43/14* (2006.01)
*H01L 27/22* (2006.01)

(52) U.S. Cl.
CPC ............ *H01L 43/065* (2013.01); *H01L 43/14* (2013.01); *H01L 27/22* (2013.01)

(58) Field of Classification Search
CPC ........ H01L 43/065; H01L 43/14; H01L 27/22
See application file for complete search history.

(56) References Cited

U.S. PATENT DOCUMENTS

| 3,816,766 A * | 6/1974 | Anselmo | G01R 33/07 257/427 |
| 4,253,107 A * | 2/1981 | Macdougall | H01L 27/22 257/427 |
| 4,929,993 A * | 5/1990 | Popovic | H01L 43/065 257/424 |
| 8,896,303 B2 * | 11/2014 | Ausserlechner | G01R 33/07 257/425 |
| 2005/0230770 A1 | 10/2005 | Oohira | |

(Continued)

FOREIGN PATENT DOCUMENTS

JP 2005-333103 A 12/2005

OTHER PUBLICATIONS

Heidari et al., Analysis and Modeling of Four-Folded Vertical Hall Devices in Current Domain, IEEE 2014.*

*Primary Examiner* — Selim U Ahmed
(74) *Attorney, Agent, or Firm* — Brinks Gilson & Lione

(57) ABSTRACT

A vertical Hall element having an improved sensitivity and reduced offset voltage includes: a second conductivity type semiconductor layer formed on a semiconductor substrate and having an impurity concentration that is distributed uniformly; a second conductivity type impurity diffusion layer formed on the semiconductor layer and having a concentration higher than in the semiconductor layer; a plurality of electrodes formed in a straight line on a surface of the impurity diffusion layer, and each formed from a second conductivity type impurity region that is higher in concentration than the impurity diffusion layer; and a plurality of first conductivity type electrode isolation diffusion layers each formed between two electrodes out of the plurality of electrodes on the surface of the impurity diffusion layer, to isolate the plurality of electrodes from one another.

20 Claims, 2 Drawing Sheets

(56) References Cited

U.S. PATENT DOCUMENTS

2006/0284611 A1* 12/2006 Ishio .................... G01R 15/202
                                                                324/117 H
2007/0290682 A1* 12/2007 Oohira .................. G01R 33/07
                                                                324/251
2009/0295375 A1* 12/2009 Oohira .................. G01D 5/145
                                                                324/207.21
2014/0210023 A1*  7/2014 Wang .................... H01L 43/065
                                                                257/421

* cited by examiner

SEMICONDUCTOR DEVICE HAVING VERTICAL HALL ELEMENT

RELATED APPLICATIONS

This application claims priority under 35 U.S.C. § 119 to Japanese Patent Application No. 2016-235998 filed on Dec. 5, 2016, the entire content of which is hereby incorporated by reference.

BACKGROUND OF THE INVENTION

1. Field of the Invention

The present invention relates to a semiconductor device, in particular, to a semiconductor device having a vertical Hall element to detect a magnetic field in a horizontal direction.

2. Description of the Related Art

A Hall element is capable of detecting position or angle as a magnetic sensor without contacting to an object and accordingly has various uses. Magnetic sensors that use a horizontal Hall element for detection of a magnetic field component perpendicular to a semiconductor substrate surface are particularly well known. There have been also proposed various magnetic sensors that use a vertical Hall element for detection of a magnetic field component parallel to a substrate surface. Proposed magnetic sensors further include a magnetic sensor that combines a horizontal Hall element and a vertical Hall element to detect a magnetic field two-dimensionally or three-dimensionally.

Enhancement of sensitivity, however, is more difficult in a vertical Hall element than in a horizontal Hall element.

In Japanese Patent Application Laid-open No. 2005-333103 (see, particularly, FIG. 3), there is proposed a configuration in which an electrode formed of an N-type diffusion layer and an electrode isolation diffusion layer (P well) for isolation of adjacent electrodes from each other are arranged in a magnetism sensing portion (N well) formed in a P-type substrate, and the impurity concentration of the magnetism sensing portion is distributed so as to be highest on a front surface of the substrate and to decrease gradually as the depth from the front surface increases. In the above-mentioned configuration the width of a depletion layer formed and the width of the electrode isolation diffusion layer which becomes narrower as the depth from the substrate's front surface increases complement each other so as to keep the flow of current from spreading in the magnetism sensing portion, thereby relatively increasing a current component that flows in a direction perpendicular to the substrate and improving sensitivity.

The structure disclosed in Japanese Patent Application Laid-open No. 2005-333103 has the following characteristics.

Specifically, a current supplied between two electrodes that sandwich the electrode isolation diffusion layer flows from one of the electrodes on the front surface of the substrate in a direction toward the rear surface of the substrate (downward), then flows in a direction parallel to the substrate in a part below the electrode isolation diffusion layer, and, from there, flows to the other of the two electrodes on the front surface of the substrate (upward). The current flowing in the direction parallel to the substrate in the part below the electrode isolation diffusion layer concentrates particularly on a region that is immediately below the electrode isolation diffusion layer and that has the lowest resistance (highest concentration) throughout the part of the magnetism sensing portion that is located below the electrode isolation diffusion layer. Since the resistance of the magnetism sensing portion increases toward the rear surface side of the substrate, substantially no current flows in a region of the magnetism sensing portion close to the rear surface of the substrate and locating below the electrode isolation diffusion layer. The flow of current in the direction parallel to the substrate consequently has a narrow width in the depth direction of the substrate.

The magnetic sensitivity of a Hall element is known to increase in proportion to the width of the flow of current. The width of the flow of current in the direction parallel to the substrate is narrow as described above in the structure disclosed in Japanese Patent Application Laid-open No. 2005-333103, resulting in a difficulty in improving sensitivity.

In addition, since in the structure disclosed in Japanese Patent Application Laid-open No. 2005-333103 the current flows in a region that has an uneven concentration distribution, variation in current path occurs, leading to an increase in offset voltage.

SUMMARY OF THE INVENTION

It is therefore an object of the present invention to provide a semiconductor device having a vertical Hall element in which sensitivity afforded by a current flowing in a direction parallel to a substrate is improved, and in which offset voltage is reduced.

According to one embodiment of the present invention, there is provided a semiconductor device comprising: a semiconductor substrate of a first conductivity type; and a vertical Hall element provided on the semiconductor substrate, the vertical Hall element comprising: a semiconductor layer of a second conductivity type formed on the semiconductor substrate and having a uniformly distributed impurity concentration; an impurity diffusion layer of the second conductivity type formed on the semiconductor layer and having a concentration higher than that of the semiconductor layer; a plurality of electrodes formed in a straight line on a surface of the impurity diffusion layer, and each formed from an impurity region of the second conductivity type, a concentration of the impurity region being higher than that of the impurity diffusion layer; and a plurality of electrode isolation diffusion layers of the first conductivity type each formed between two electrodes out of the plurality of electrodes on the surface of the impurity diffusion layer to isolate the plurality of electrodes from one another.

According to the present invention, in the impurity diffusion layer of the second conductivity type, a depletion layer formed around each electrode isolation diffusion layer of the first conductivity type spreads in the direction of the semiconductor layer (downward) as well, to the vicinity of an upper surface of the semiconductor layer.

A current supplied between two electrodes therefore flows from one of the electrodes in the direction of a rear surface of the semiconductor substrate (downward), then flows in a direction parallel to the substrate while spreading throughout the entire interior of the semiconductor layer, and, from there, flows to the other of the two electrodes (upward).

In other words, because the lowermost part of the depletion layer formed around each electrode isolation diffusion layer spreads to the vicinity of the upper surface of the semiconductor layer, and because the current that flows in the direction parallel to the substrate is hindered by the presence of the electrode isolation diffusion layer and the depletion layer, the current scarcely or never flows in the impurity diffusion layer. The most or all of the current flowing in the direction parallel to the substrate accordingly flows inside the semiconductor layer. In addition, the current flow spreads throughout the entire interior of the semiconductor layer without localizing on any part thereof since the concentration distribution is uniform to make the resistance even throughout the semiconductor layer, without low resistance part or high resistance part.

Accordingly, it is possible to increase the width of the current flowing in the direction parallel to the semiconductor substrate and in the depth direction, thereby enhancing the magnetic sensitivity of the Hall element.

Since the region in which the current flows in the direction parallel to the substrate is a semiconductor layer having a uniform concentration distribution, variation in current path is prevented, permitting reduction of the offset voltage.

DETAILED DESCRIPTION OF THE PREFERRED EMBODIMENTS

Embodiments for carrying out the present invention are described in detail below with reference to the drawings.

Figure 1A:
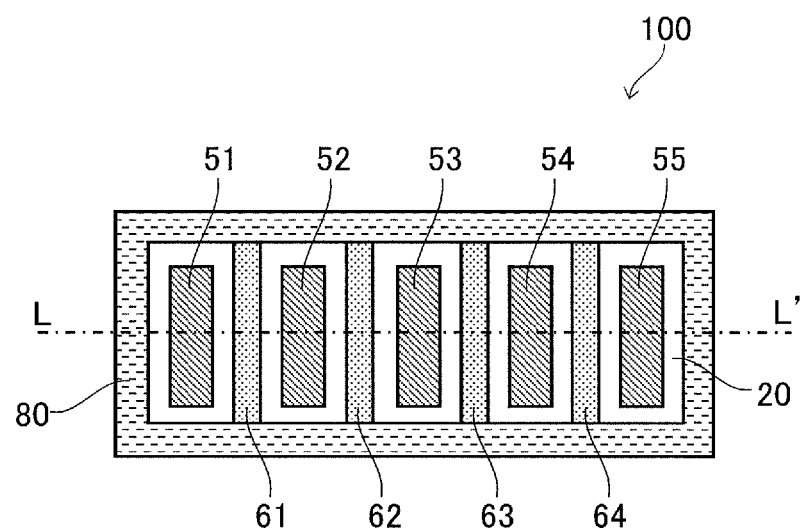
FIG. 1A is a plan view of a semiconductor device with a vertical Hall element according to an embodiment of the present invention.
Figure 1B:
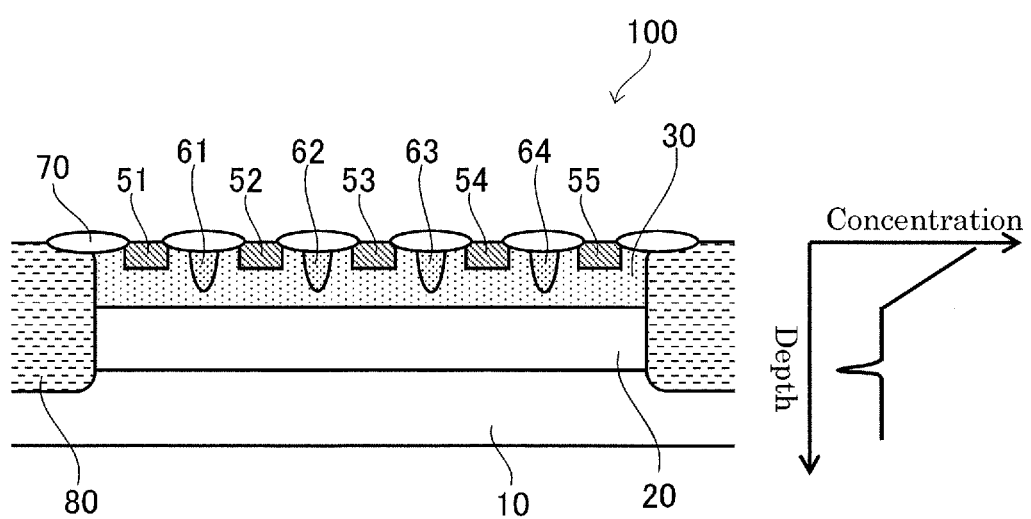
FIG. 1B is a sectional view taken along the line L-L' of FIG. 1A.

FIG. 1A and FIG. 1B are views for illustrating a semiconductor device with a vertical Hall element according to an embodiment of the present invention. FIG. 1A is a plan view of the semiconductor device, and FIG. 1B is a sectional view taken along the line L-L' of FIG. 1A.

The semiconductor device of this embodiment includes, as illustrated in FIG. 1A and FIG. 1B, a semiconductor substrate 10 of a P type, which is a first conductivity type, a vertical Hall element 100 provided on the semiconductor substrate 10, and a P-type element isolation diffusion layer 80 formed so as to surround the perimeter of the vertical Hall element 100.

The vertical Hall element 100 includes a semiconductor layer 20 of an N type, which is a second conductivity type, an N-type impurity diffusion layer 30 formed on the N-type semiconductor layer 20, electrodes 51 to 55, which are made from N-type impurity regions formed in a straight line on a surface of the N-type impurity diffusion layer 30 and which serve as drive current supply electrodes and Hall voltage output electrodes, and P-type electrode isolation diffusion layers 61 to 64, which are each provided between two of the electrodes 51 to 55 in order to isolate the electrodes 51 to 55 from one another.

The vertical Hall element 100 further includes an insulating film, for example, a $SiO_2$ film 70, so as to cover a surface of the N-type impurity diffusion layer 30, except for regions in which the electrodes 51 to 55 are formed. This enables the semiconductor device to control a current flow parallel to the semiconductor substrate 10 on the surface of the N-type impurity diffusion layer 30.

The concentration profile of impurities contained in the P-type semiconductor substrate 10, the N-type semiconductor layer 20, and the N-type impurity diffusion layer 30 is illustrated on the right hand side of FIG. 1B.

As can be seen in the concentration profile, the distribution of the impurity concentration of the N-type semiconductor layer 20 is uniform, and the impurity concentration of the N-type impurity diffusion layer 30 is distributed so as to be highest near the surface of the N-type impurity diffusion layer 30 and to decrease as the distance from the surface to the semiconductor layer 20 increases.

This configuration is formed by, for example, forming an epitaxial layer on the semiconductor substrate 10 through epitaxial growth and then diffusing N-type impurities to a given depth to form the N-type impurity diffusion layer 30 described above in an upper part of the epitaxial layer and to leave the N-type semiconductor layer 20 in a lower part of the epitaxial layer in which the N-type impurities are not diffused.

The N-type semiconductor layer 20 formed in this manner has a constant concentration that is lower than the concentration in the lowermost part of the N-type impurity diffusion layer 30.

In order to achieve higher magnetic sensitivity, the N-type semiconductor layer 20 is preferred to be thicker, for example, 6 μm or more. The impurity concentration of the N-type semiconductor layer 20 is preferred to be approximately $1 \times 10^{15}$ atoms/cm$^3$ to approximately $1 \times 10^{17}$ atoms/cm$^3$. The impurity concentration near the surface of the N-type impurity diffusion layer 30 is preferred to be approximately $1 \times 10^{17}$ atoms/cm$^3$ to approximately $1 \times 10^{18}$ atoms/cm$^3$. The depth of the N-type impurity diffusion layer 30 is preferred to be as shallow as 3 μm to 5 μm.

The element isolation diffusion layer 80 is formed so as to reach the P-type semiconductor substrate 10 in depth past the bottom of the N-type semiconductor layer 20. This electrically isolates the vertical Hall element 100 from other regions (not shown) on the semiconductor substrate 10.

Elements provided in the other regions (not shown) on the semiconductor substrate 10 that are electrically isolated from the vertical Hall element 100 by the P-type element isolation diffusion layer 80 include a transistor that is a constituent of a circuit configured to process a signal output from the vertical Hall element 100, or a circuit configured to supply a signal to the vertical Hall element 100. An N well is formed in at least a part of the other regions in order to form such elements.

The N-type impurity diffusion layer 30 can thus be formed simultaneously with the N well in the same manufacturing step. The N well accordingly has the same depth and the same concentration distribution as those of the N-type impurity diffusion layer 30.

In this manner, according to this embodiment, the N-type impurity diffusion layer 30 can thus be formed without increasing the number of manufacturing processes.

The P-type electrode isolation diffusion layers 61 to 64 are formed by, for example, selectively diffusing P-type impurities in the N-type impurity diffusion layer 30.

The electrodes 51 to 55 are formed by, for example, covering the tops of the formed P-type electrode isolation diffusion layers 61 to 64 with the $SiO_2$ film 70 that is formed through LOCOS, while leaving regions in which the electrodes 51 to 55 are to be formed, and then introducing N-type impurities with the $SiO_2$ film 70 used as a mask. The electrodes 51 to 55 are formed so as to have a depth equal to or less than the depth of the P-type electrode isolation diffusion layers 61 to 64.

Figure 2:
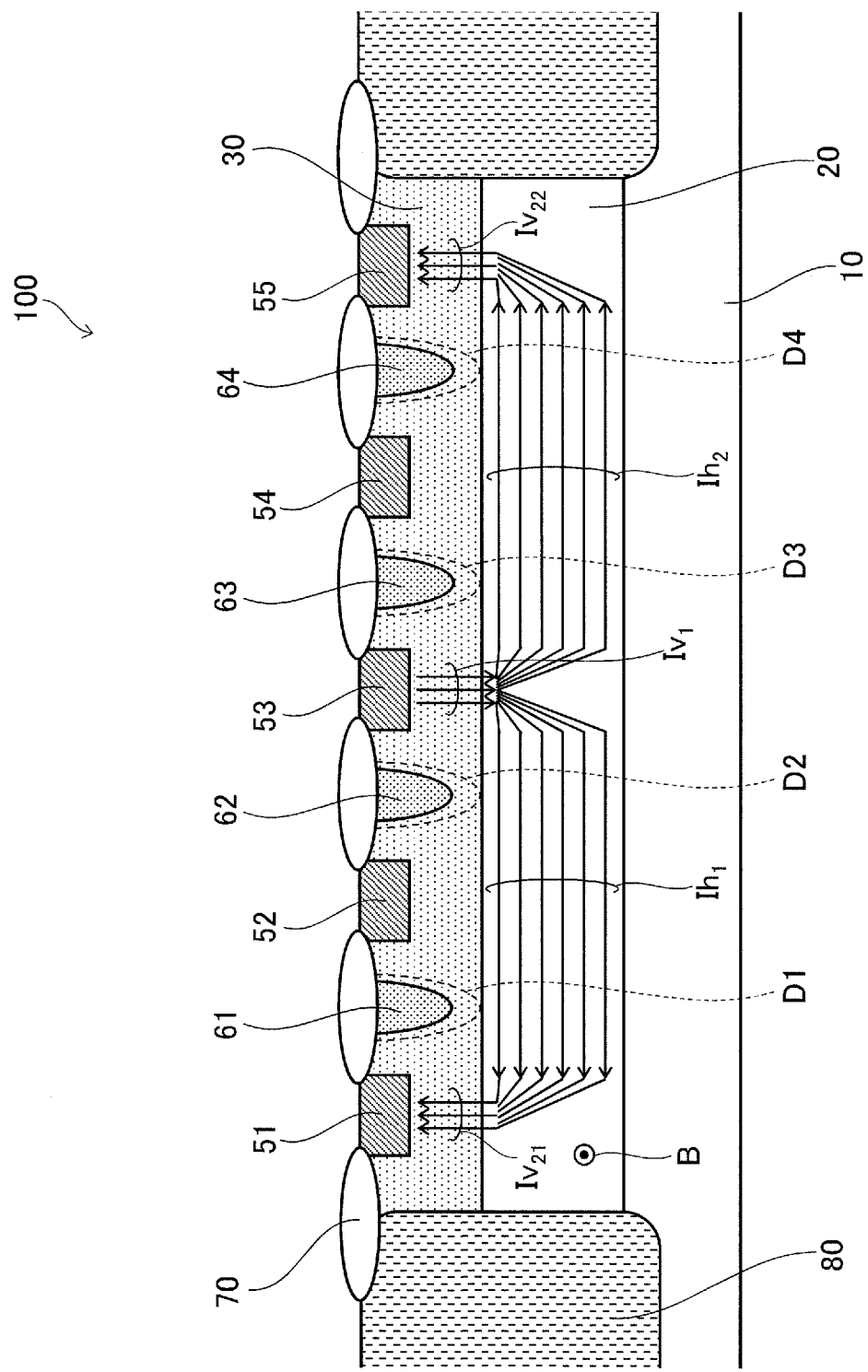
FIG. 2 is an enlarged view of FIG. 1B.

A description given next with reference to FIG. 2 is about the principle of detecting a magnetic component that is in a direction parallel to the semiconductor substrate 10 in the vertical Hall element 100 of the semiconductor device according to this embodiment.

FIG. 2 is an enlarged view of the sectional view of FIG. 1B, and is a schematic illustration of a current flow that is observed when a drive current is supplied to the electrodes 51, 53, and 55 so that the current flows from the electrode 53 to the electrodes 51 and 55.

As indicated by "B" in FIG. 2, a magnetic field is applied from the far side to the near side on the drawing sheet, in the direction parallel to the semiconductor substrate 10.

Depletion layers D1 to D4 are formed around the P-type electrode isolation diffusion layers 61 to 64, respectively, as indicated by the broken lines in FIG. 2. The lowermost parts of the depletion layers D1 to D4 are positioned at substantially the same level as the top surface of the N-type semiconductor layer 20.

Specifically, in the vertical Hall element 100 of this embodiment, the depth and impurity concentration of the P-type electrode isolation diffusion layers 61 to 64 and the depth and impurity concentration of the N-type impurity diffusion layer 30 are set so that the lowermost parts of the depletion layers D1 to D4 are positioned at substantially the same level as the top surface of the N-type semiconductor layer 20. Depletion layers are also formed inside the P-type electrode isolation diffusion layers 61 to 64. The depletion layers inside the P-type electrode isolation diffusion layers 61 to 64, however, are omitted in FIG. 2.

When a current is supplied from the electrode 53 to the electrodes 51 and 55 in the thus configured vertical Hall element 100, the current first flows from the electrode 53 in a direction perpendicular to the semiconductor substrate 10 as indicated by the arrows $Iv_1$, toward a rear surface of the semiconductor substrate 10 (downward) in the N-type impurity diffusion layer 30.

After that, the current flows in directions parallel to the semiconductor substrate 10 (leftward direction and rightward direction) as indicated by the arrows $Ih_1$ and the arrows $Ih_2$. The current flowing in the directions parallel to the semiconductor substrate 10 cannot flow in the N-type impurity diffusion layer 30 due to the presence of the P-type electrode isolation diffusion layers 62 and 63 and the depletion layers D2 and D3 on the left side and right side of the electrodes 53, and flows in the N-type semiconductor layer 20 instead as indicated by the arrows $Ih_1$ and the arrows $Ih_2$.

Since the impurity concentration distribution of the N-type semiconductor layer 20 is constant, the resistance in the N-type semiconductor layer 20 is uniform. Accordingly there is no low resistance part nor high resistance part in the N-type semiconductor layer 20, the flow of the current indicated by the arrows $Ih_1$ and the arrows $Ih_2$ spreads throughout the entire interior of the N-type semiconductor layer 20, without concentrating on any part of the N-type semiconductor layer 20, as illustrated in FIG. 2.

The current then flows in a direction perpendicular to the semiconductor substrate 10 as indicated by the arrows $Iv_{21}$ and the arrows $Iv_{22}$ toward the surface of the N-type impurity diffusion layer 30 (upward) in the N-type impurity diffusion layer 30, to flow into the electrodes 51 and 55.

The magnetic field acts on the currents $Iv_1$, $Iv_{21}$, $Iv_{22}$, $Ih_1$, and $Ih_2$ flowing in this manner, to thereby generate an electromotive force for each of the currents in a direction perpendicular to the current and the magnetic field both. Specifically, a Lorentz force is generated in a direction from the electrode 53 toward the electrode 52 (leftward direction) for the current $Iv_1$, a direction from the electrode 51 toward the electrode 52 (rightward direction) for the current $Iv_{21}$, a direction from the electrode 55 toward the P-type electrode isolation diffusion layer 64 (rightward direction) for the current $Iv_{22}$, a direction from the N-type semiconductor layer 20 toward the electrode 52 (upward direction) for the current $Ih_1$, and a direction from the N-type semiconductor layer 20 toward the semiconductor substrate 10 (downward direction) for the current $Ih_2$.

In this embodiment, the magnetic field in a direction perpendicular to the currents $Ih_1$ and $Ih_2$ generates particularly large Lorentz forces against the currents $Ih_1$ and $Ih_2$ which flow in the directions parallel to the semiconductor substrate 10, resulting in generation of a potential difference between the electrode 52 and the electrode 54, by which detection of the magnetic field is permitted.

Since the N-type impurity diffusion layer 30 in this embodiment has an impurity concentration that increases toward the surface of the N-type impurity diffusion layer 30 as described above, the depletion layers D1 to D4 which are formed along junction portions between the N-type impurity diffusion layer 30 and each of the P-type electrode isolation diffusion layers 61 to 64 hardly spread toward the N-type impurity diffusion layer 30 as illustrated in FIG. 2. The spreading of the depletion layers D1 to D4 formed around the P-type electrode isolation diffusion layers 61 to 64 toward the electrodes 51 to 55 can accordingly be suppressed in the vicinity of the surface of the N-type impurity diffusion layer 30. Accordingly the distance between the electrodes 51 to 55 and the P-type electrode isolation diffusion layers 61 to 64 can be set small since the currents are hardly restricted by the depletion layers D1 to D4.

The distance traveled by the current $Ih_1$ and the current $Ih_2$, which flow in the directions parallel to the semiconductor substrate 10, can accordingly be set short. This means that the Hall element's magnetic sensitivity, which is in reverse proportion to the length of a current flow, can be enhanced. Another advantageous effect is that, with the distance between the electrodes 51 to 55 and the P-type electrode isolation diffusion layers 61 to 64 set small, the chip size can be reduced.

In this embodiment, the flows of the currents $Ih_1$ and $Ih_2$, which flow in the directions parallel to the semiconductor substrate 10, spread throughout the entire interior of the N-type semiconductor layer 20 as described above, and can accordingly have a large width in the depth direction. The Hall element's magnetic sensitivity, which is in proportion to the width of the flow of current, can further be improved according to this embodiment. The N-type semiconductor layer 20 is therefore preferred to be thicker as described above.

The mobility in the N-type semiconductor layer 20 is high in this embodiment, in which the currents flow in the directions parallel to the semiconductor substrate 10 in the N-type semiconductor layer 20 having a low impurity concentration. The Hall element's magnetic sensitivity, which is known to rise in proportion to mobility as well, can therefore be enhanced further according to this embodiment.

The uniform concentration distribution in the N-type semiconductor layer 20 prevents the paths of the currents flowing in the directions parallel to the semiconductor substrate 10 from varying, which provides an advantageous effect in that the offset voltage can be reduced.

The currents $Iv_1$, $Iv_{21}$, and $Iv_{22}$ flowing perpendicularly to the semiconductor substrate 10, on the other hand, flow in the N-type impurity diffusion layer 30 having a concentration distribution in which the impurity concentration is highest near the surface of the N-type impurity diffusion layer 30 and decreases as the distance from the surface to the semiconductor layer 20 increases. However, the N-type impurity diffusion layer 30 is formed shallow enough as described above that the distance traveled by the currents $Iv_1$, $Iv_{21}$, and $Iv_{22}$ is short. The currents $Iv_1$, $Iv_{21}$, and $Iv_{22}$, though flow in the N-type impurity diffusion layer 30 having a concentration distribution, the variation of the current path is so small as to hardly become a factor for an increase in offset voltage.

In this manner, according to this embodiment, a semiconductor device that includes a vertical Hall element high in sensitivity and small in offset voltage can thus be realized.

According to this embodiment, the offset voltage can be made small as described above. However, it is difficult to reduce the offset voltage completely to zero.

A method of eliminating the offset voltage by spinning current in the vertical Hall element 100 of this embodiment is described below.

Referring to FIG. 1A and FIG. 1B, first, a current is supplied from the electrode 53 to the electrodes 51 and 55, with the electrodes 51, 53, and 55 as control current supply electrodes, to obtain a voltage between the electrode 52 and the electrode 54, which are Hall voltage output electrodes, as an output voltage Vout1. An output voltage Vout2, which is a voltage between the electrode 52 and the electrode 54, is also obtained by supplying a current in a reverse direction, namely, a direction from the electrodes 51 and 55 to the electrode 53.

The control current supply electrodes and the Hall voltage output electrodes are switched and a current is supplied from the electrode 52 to the electrode 54 to obtain a voltage between the electrode 53 and the electrodes 51 and 55 as an output voltage Vout3. An output voltage Vout4, which is a voltage between the electrode 53 and the electrodes 51 and 55, is also obtained by supplying a current in a reverse direction, namely, a direction from the electrode 54 to the electrode 52.

The offset voltage can be eliminated by addition or subtraction of the output voltages Vout1 to Vout4.

In this manner, the offset voltage can be eliminated by spinning current in which a plurality of electrodes aligned along a straight line is used as control current supply electrodes and Hall voltage output electrodes alternatingly, the direction of the current flow is suitably switched, and the roles of the control current supply electrodes and the Hall voltage output electrodes are interchanged. This spinning current is not limited to the case in which the number of electrodes is five, and is executable when there are at least five electrodes.

In a common vertical Hall element, a change in a depletion layer causes in some cases the path of a current flow to vary depending on the direction of the current flow. The elimination of the offset voltage by spinning current is incomplete in such cases.

In contrast, the vertical Hall element 100 of this embodiment prevents the spreading of the depletion layers formed between the N-type impurity diffusion layer 30 and the P-type electrode isolation diffusion layers 61 to 64 as described above. This allows currents in the N-type impurity diffusion layer 30 and the N-type semiconductor layer 20 to flow stably without receiving effect from the depletion layers, and the offset voltage can therefore be eliminated effectively by spinning current.

The embodiment of the present invention has been described above, but the present invention is not limited to the above-mentioned embodiment, and it is to be understood that various modifications can be made thereto without departing from the gist of the present invention.

For instance, while the lowermost parts of the depletion layers D1 to D4 are positioned at substantially the same level as the top surface of the N-type semiconductor layer 20 in the embodiment described above, the lowermost parts of the depletion layers D1 to D4 and the top surface of the N-type semiconductor layer 20 do not always need to position at the same level. In other words, a current flowing in a direction parallel to the substrate can hardly flow in the N-type impurity diffusion layer 30 and flows in the N-type semiconductor layer 20 instead, when the lowermost parts of the depletion layers D1 to D4 reach the vicinity of the top surface of the N-type semiconductor layer 20. Alternatively, when the lowermost parts of the depletion layers D1 to D4 reach past the top surface of the N-type semiconductor layer 20 to overlap with the N-type semiconductor layer 20, a current flowing in a direction parallel to the substrate cannot flow in the N-type impurity diffusion layer 30 and flows in the N-type semiconductor layer 20 instead. The desired effects can accordingly be obtained also in such cases, although to a different degree from the one in the embodiment described above.

The first conductivity type and the second conductivity type, which are the P type and the N type, respectively, in the description given above, may be switched to set the first conductivity as the N type and the second conductivity as the P type.

The number of electrodes in the embodiment described above is five. However, at least three electrodes in total, with two electrodes serving as drive current supply electrodes and one electrode serving as a Hall voltage output electrode, are sufficient when the offset voltage can be reduced to a value small enough to render spinning current unnecessary, or is tolerable.

What is claimed is:

1. A semiconductor device, comprising:
   a semiconductor substrate of a first conductivity type; and
   a vertical Hall element on the semiconductor substrate,
   the vertical Hall element comprising:
      a semiconductor layer of a second conductivity type on the semiconductor substrate and having a uniformly distributed impurity concentration;
      an impurity diffusion layer of the second conductivity type on the semiconductor layer and having a concentration of impurities higher than a concentration of impurities in the semiconductor layer;
      a plurality of electrodes in a straight line on a surface of the impurity diffusion layer, each including an impurity region of the second conductivity type, where a concentration of impurities in the impurity region is higher than the concentration of impurities in the impurity diffusion layer; and
      a plurality of electrode isolation diffusion layers of the first conductivity type, each between two adjacent electrodes among the plurality of electrodes on the surface of the impurity diffusion layer, and that isolate the plurality of electrodes from one another.

2. A semiconductor device comprising:
   a semiconductor substrate of a first conductivity type; and
   a vertical Hall element on the semiconductor substrate,
   the vertical Hall element comprising:
      a semiconductor layer of a second conductivity type on the semiconductor substrate and having a uniformly distributed impurity concentration;
      an impurity diffusion layer of the second conductivity type on the semiconductor layer and having a concentration of impurities higher than a concentration of impurities in the semiconductor layer;
      a plurality of electrodes in a straight line on a surface of the impurity diffusion layer, each including an impurity region of the second conductivity type, where a concentration of impurities in the impurity region is higher than the concentration of impurities in the impurity diffusion layer; and a plurality of electrode isolation diffusion layers of the first conductivity type, each between two adjacent electrodes among the plurality of electrodes on the surface of the impurity diffusion layer, and that isolate the plurality of electrodes from one another, wherein a lowermost part of a depletion layer formed around each of the plurality of electrode isolation diffusion layers is positioned at substantially the same level as a top surface of the semiconductor layer.

3. A semiconductor device according to claim 1, wherein the impurity diffusion layer has a concentration distribution in which the concentration decreases as a distance from the surface to the semiconductor layer increases.

4. A semiconductor device according to claim 2, wherein the impurity diffusion layer has an impurity concentration distribution in which the concentration of impurities decreases as a distance from the top surface to the semiconductor layer increases.

5. A semiconductor device according to claim 1, wherein the semiconductor layer and the impurity diffusion layer comprise an epitaxial layer.

6. A semiconductor device according to claim 2, wherein the semiconductor layer and the impurity diffusion layer comprise an epitaxial layer.

7. A semiconductor device according to claim 3, wherein the semiconductor layer and the impurity diffusion layer comprise an epitaxial layer.

8. A semiconductor device according to claim 4, wherein the semiconductor layer and the impurity diffusion layer comprise an epitaxial layer.

9. A semiconductor device according to claim 1, wherein the surface of the impurity diffusion layer and surfaces of the plurality of electrode isolation diffusion layers are covered with an insulating film, except for regions in which the plurality of electrodes reside.

10. A semiconductor device according to claim 2, wherein the surface of the impurity diffusion layer and surfaces of the plurality of electrode isolation diffusion layers are covered with an insulating film, except for regions in which the plurality of electrodes reside.

11. A semiconductor device according to claim 5, wherein the surface of the impurity diffusion layer and surfaces of the plurality of electrode isolation diffusion layers are covered with an insulating film, except for regions in which the plurality of electrodes reside.

12. A semiconductor device according to claim 6, wherein the surface of the impurity diffusion layer and surfaces of the plurality of electrode isolation diffusion layers are covered with an insulating film, except for regions in which the plurality of electrodes reside.

13. A semiconductor device according to claim 1, wherein a number of the plurality of electrodes is at least three.

14. A semiconductor device according to claim 2, wherein the plurality of electrodes comprise at least three electrodes.

15. A semiconductor device according to claim 9, wherein a number of the plurality of electrodes is at least three.

16. A semiconductor device according to claim 10, wherein the plurality of electrodes comprise at least three electrodes.

17. A semiconductor device according to claim 1, further comprising:

an element isolation diffusion layer of the first conductivity type, which encloses the vertical Hall element to electrically isolate the vertical Hall element from surroundings; and an element forming region around the element isolation diffusion layer and having an element therein that is a constituent of one of a circuit configured to process an output signal from the vertical Hall element, and a circuit configured to supply a signal to the vertical Hall element, wherein the element forming region comprises a well of the second conductivity type, and wherein the well has a depth and a concentration distribution that are the same as a depth and concentration distribution of the impurity diffusion layer.

18. A semiconductor device according to claim 2, further comprising:

an element isolation diffusion layer of the first conductivity type that encloses the vertical Hall element and electrically isolates the vertical Hall element from surrounding regions; and an element forming region around the element isolation diffusion layer and configured to accommodate an element that is a constituent of one of: a circuit configured to process an output signal from the vertical Hall element; and a circuit configured to supply a signal to the vertical Hall element, wherein the element forming region comprises a well of the second conductivity type, and wherein the well has a depth and a concentration distribution that are the same as a depth and concentration distribution of the impurity diffusion layer.

19. A semiconductor device according to claim 13, further comprising:

an element isolation diffusion layer of the first conductivity type, which encloses the vertical Hall element to electrically isolate the vertical Hall element from surroundings; and an element forming region around the element isolation diffusion layer and having an element therein that is a constituent of one of a circuit configured to process an output signal from the vertical Hall element, and a circuit configured to supply a signal to the vertical Hall element, wherein the element forming region comprises a well of the second conductivity type, and wherein the well has a depth and a concentration distribution that are the same as a depth and concentration distribution of the impurity diffusion layer.

20. A semiconductor device according to claim 14, further comprising:

an element isolation diffusion layer of the first conductivity type that encloses the vertical Hall element and electrically isolates the vertical Hall element from surrounding regions; and an element forming region, which is provided around the element isolation diffusion layer and configured to accommodate an element that is a constituent of one of a circuit configured to process an output signal from the vertical Hall element and a circuit configured to supply a signal to the vertical Hall element, wherein the element forming region comprises a well of the second conductivity type, and wherein the well has a depth and a concentration distribution that are the same as a depth and concentration distribution of the impurity diffusion layer.

* * * * *